US010804106B2

(12) United States Patent
Ebrish et al.

(10) Patent No.: US 10,804,106 B2
(45) Date of Patent: Oct. 13, 2020

(54) HIGH TEMPERATURE ULTRA-FAST ANNEALED SOFT MASK FOR SEMICONDUCTOR DEVICES

(71) Applicant: International Business Machines Corporation, Armonk, NY (US)

(72) Inventors: Mona Ebrish, Albany, NY (US); Oleg Gluschenkov, Tannersville, NY (US); Indira Seshadri, Niskayuna, NY (US); Ekmini Anuja De Silva, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 15/901,362

(22) Filed: Feb. 21, 2018

(65) Prior Publication Data

US 2019/0259616 A1    Aug. 22, 2019

(51) Int. Cl.
*H01L 21/26* (2006.01)
*H01L 21/225* (2006.01)
*H01L 21/268* (2006.01)
*H01L 21/8234* (2006.01)
*H01L 21/02* (2006.01)
*H01L 21/265* (2006.01)
*H01L 21/033* (2006.01)

(52) U.S. Cl.
CPC .... *H01L 21/2254* (2013.01); *H01L 21/02118* (2013.01); *H01L 21/02282* (2013.01); *H01L 21/02318* (2013.01); *H01L 21/0332* (2013.01); *H01L 21/268* (2013.01); *H01L 21/26513* (2013.01); *H01L 21/823431* (2013.01)

(58) Field of Classification Search
USPC .......................................................... 438/535
See application file for complete search history.

(56) References Cited

U.S. PATENT DOCUMENTS

| 6,143,476 | A | 11/2000 | Ye et al. | |
|---|---|---|---|---|
| 7,303,855 | B2 * | 12/2007 | Hatakeyama | G03F 7/091 430/270.1 |
| 7,637,269 | B1 | 12/2009 | Zin et al. | |

(Continued)

OTHER PUBLICATIONS

Pelaz, et al., "Ion-beam-induced amorphization and recrystallization in silicon," Dated: Oct. 21, 2004, 34 pages.

*Primary Examiner* — Caleb E Henry
(74) *Attorney, Agent, or Firm* — Amin, Turocy & Watson, LLP (57) ABSTRACT

Techniques for providing a high temperature soft mask for semiconductor devices are described. In an embodiment, spin coating semiconductor device components with organic planarization material having a defined aromatic content aromatic content to provide an organic planarization layer. The method can further comprise ultra-fast annealing the organic planarization layer and forming an implanted or doped region in the semiconductor device. Three-dimensional FinFET components of a device can be spin coated with organic planarization material having high aromatic content, with the device cured at a first temperature. The organic planarization layer can be ultra-fast annealed at a second temperature that is greater than the first temperature. Aspects can include patterning the device, and forming an implanted or doped region in a semiconductor device.

18 Claims, 10 Drawing Sheets

(56) References Cited

U.S. PATENT DOCUMENTS

| | | | |
|---|---|---|---|
| 7,846,645 B2 | 12/2010 | Urakawa | |
| 8,334,211 B2 | 12/2012 | Kewley | |
| 8,987,070 B2 | 3/2015 | Cheng et al. | |
| 8,992,785 B2 | 3/2015 | Hautala | |
| 9,330,938 B2 | 5/2016 | Ando et al. | |
| 9,443,848 B1 | 9/2016 | Basker | |
| 2013/0175503 A1* | 7/2013 | Cohen | H01L 29/66439 257/29 |
| 2014/0070155 A1* | 3/2014 | Cohen | H01L 45/06 257/2 |
| 2014/0106575 A1* | 4/2014 | Yoshimoto | H01L 21/02118 438/781 |
| 2014/0353826 A1* | 12/2014 | Guillorn | H01L 21/28518 257/744 |
| 2015/0013967 A1* | 1/2015 | Parsche | E21B 43/30 166/245 |
| 2015/0166711 A1* | 6/2015 | Cui | C08G 8/04 438/703 |
| 2015/0228762 A1* | 8/2015 | He | H01L 29/66795 257/410 |
| 2015/0315333 A1* | 11/2015 | Han | G03F 7/36 430/323 |
| 2016/0293756 A1 | 10/2016 | Liu et al. | |
| 2017/0053891 A1* | 2/2017 | Rubin | H01L 24/83 |
| 2018/0315667 A1* | 11/2018 | Kwon | H01L 21/823842 |
| 2019/0198398 A1* | 6/2019 | De Silva | H01L 21/823418 |

\* cited by examiner

HIGH TEMPERATURE ULTRA-FAST ANNEALED SOFT MASK FOR SEMICONDUCTOR DEVICES

BACKGROUND

The subject disclosure relates generally to semiconductor device manufacturing, and more particularly to fabricating a semiconductor device using a high temperature soft mask, such as for hot implanting or selective epitaxial growth.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to an embodiment, a method can comprise spin coating semiconductor device components with organic planarization material having a defined aromatic content to provide an organic planarization layer. The method can further comprise ultra-fast annealing the organic planarization layer and forming an implanted or doped region in the semiconductor device.

According to another embodiment, a method can comprise spin coating three-dimensional Fin Field Effect Transistor components of a device with organic planarization material having a defined aromatic content of at least thirty-five percent to provide an organic planarization layer. The method can further comprise curing the device at a first temperature, ultra-fast annealing the organic planarization layer at a second temperature that is greater than the first temperature, patterning the device and forming an implanted or doped region in a semiconductor device.

According to yet another embodiment, a method can comprise spin coating semiconductor device components with organic planarization material having a defined aromatic content, ultra-fast annealing an organic planarization layer, and forming an implanted or doped region in a semiconductor device.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Further, it is to be understood that the present disclosure will be described in terms of a given illustrative architecture; however, other architectures, structures, substrate materials and process features and steps can be varied within the scope of the present disclosure.

It will also be understood that when an element such as a layer, region or substrate is referred to as being "on" or "over" another element, it can be directly on the other element or intervening elements can also be present. In contrast, only if and when an element is referred to as being "directly on" or "directly over" another element, are there are no intervening element(s) present. Note that orientation is generally relative; e.g., "on" or "over" can be flipped, and if so, can be considered unchanged, even if technically appearing to be under or below/beneath when represented in a flipped orientation. It will also be understood that when an element is referred to as being "connected" or "coupled" to another element, it can be directly connected or coupled to the other element or intervening elements can be present. In contrast, only if and when an element is referred to as being "directly connected" or "directly coupled" to another element, are there no intervening element(s) present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanism (e.g., by providing a copy of the storage medium storing the design) or electronically (e.g., through the Internet) to such entities, directly or indirectly. The stored design is then converted into the appropriate format (e.g., Graphical Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Structures and methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip can be mounted in a single chip package (such as a plastic carrier, with leads that are affixed to a motherboard or other higher level carrier) or in a multichip package (such as a ceramic carrier that has either or both surface interconnections or buried interconnections). In any event, the chip then can be integrated with other chips, discrete circuit elements, and/or other signal processing devices as part of either: an intermediate product, such as a motherboard; or an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Figure 1:
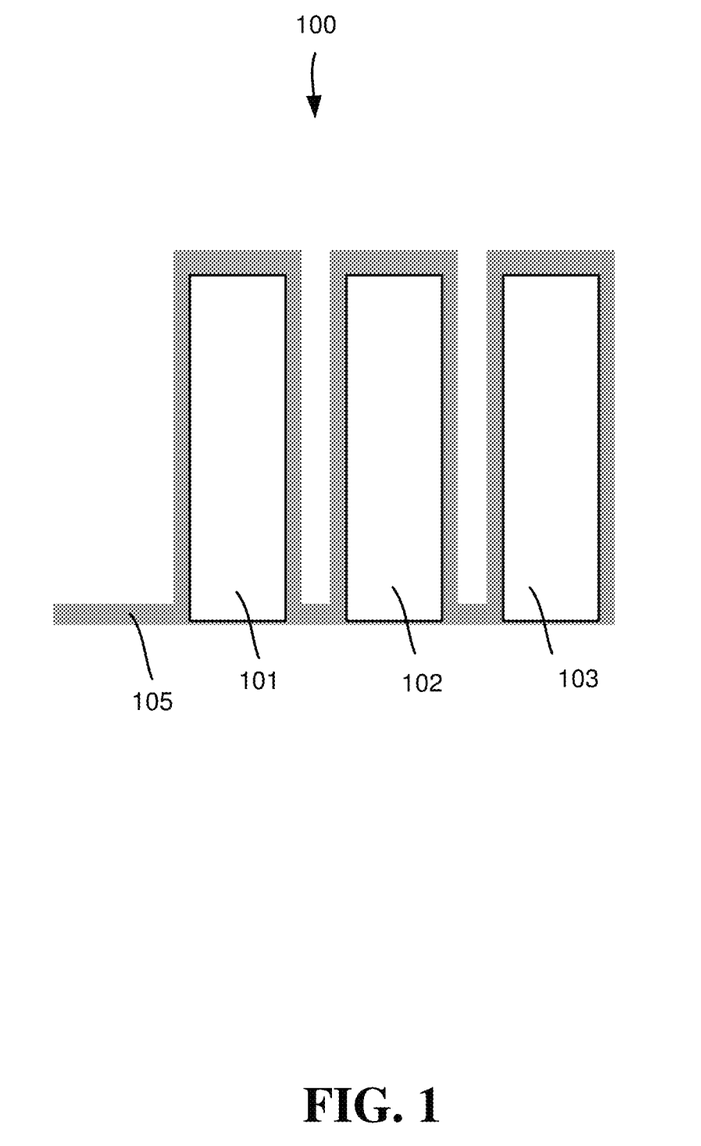
FIG. 1 is an illustration of an example, non-limiting semiconductor device comprising fins of a Fin Field Effect Transistor (FinFET) for use with a high temperature soft mask in accordance with one or more embodiments described herein.
Figure 2:
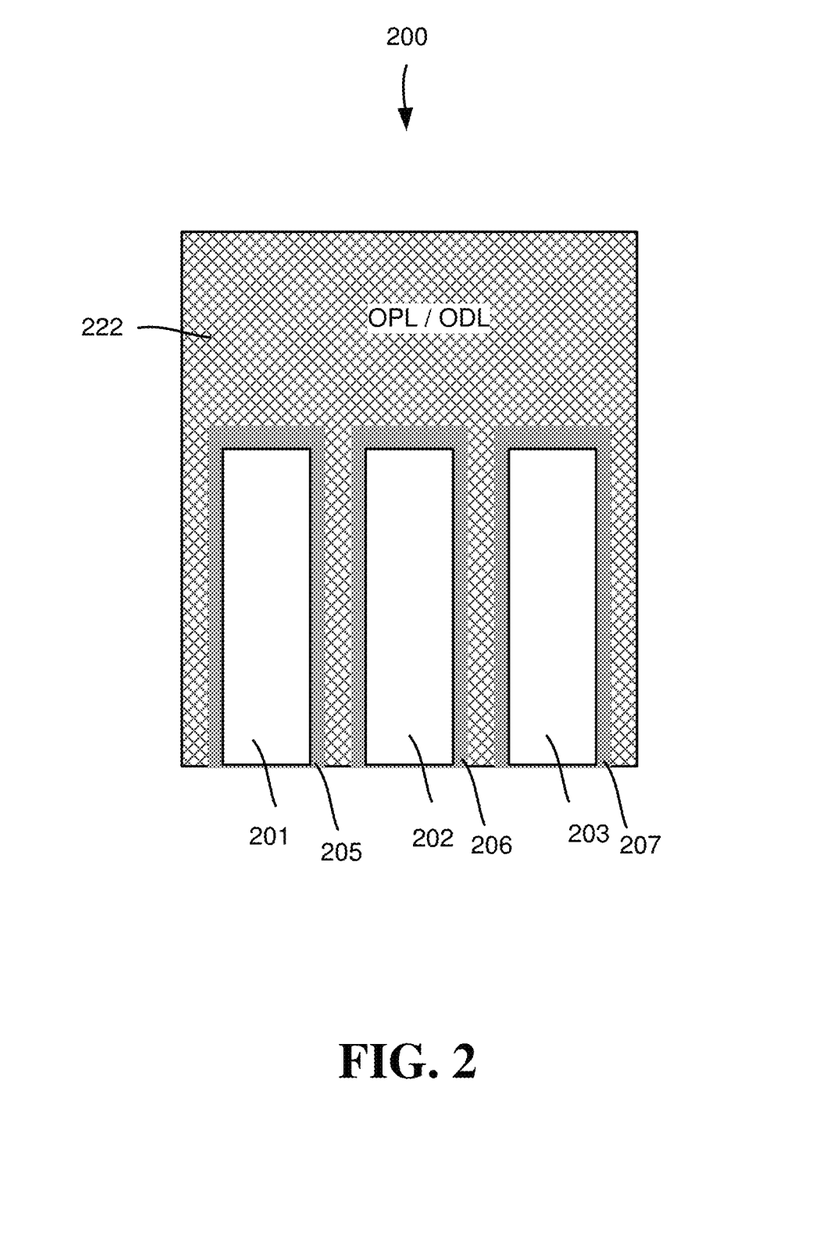
FIG. 2 is an illustration of an example, non-limiting semiconductor device comprising fins of a FinFET after spin coating with an organic planarization material in accordance with one or more embodiments described herein.

FIGS. 1 and 2 illustrate semiconductor material 100 and 200, respectively, such as Fin Field Effect Transistor (FinFET) components, e.g., represented as silicon (Si) fins 101-103 (with mask 105 or the like comprising an insulating layer such as silicon oxide, silicon nitride, a low dielectric constant material, or other suitable insulator) and silicon germanium (SiGe) fins 201-203 (with similar masks 205-207), respectively. Repetitive description of like elements employed in respective embodiments is omitted for sake of brevity. As will be understood, the embodiment described forms a semiconductor such as a FinFET using material(s) and process(es) as generally set forth herein.

For complementary metal oxide semiconductor (CMOS) technology, having a soft block mask layer that can sustain high temperatures that can be employed for semiconductor fabrication. In general, as the size of implanted atoms become larger, the implant temperature typically needs to be higher to avoid full amorphization. Furthermore, in order to prevent extensive damage to the underlying semiconductor material, the implantation temperature needs to be even higher and preferably above about 400° C. (degrees Centigrade). Alternatively, creating selective epitaxial layers with in-situ doping requires substrate temperatures above about 400° C. and block mask material immune to the epitaxial growth precursors.

One or more embodiments can employ materials that are thermally stable at 400° C. or higher. Such new materials can also be compatible with three-dimensional (3-D) structures, e.g., in order to avoid voids. Further, such new materials can be able to be selectively removed (e.g., selectivity from commonly used layers such as oxides and nitrides is significant).

Figure 3:
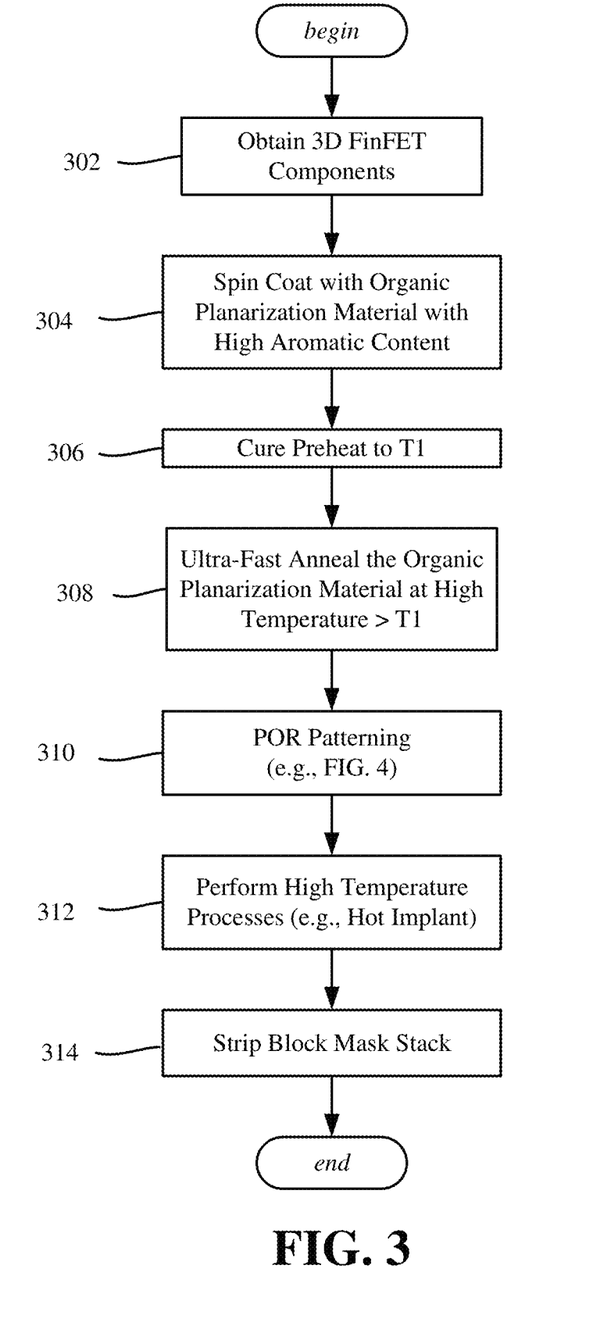
FIG. 3 illustrates an example, non-limiting flow diagram representing operations of a process that provides a high temperature soft mask in accordance with one or more embodiments described herein.

As described herein, one suitable material comprises a highly thermally stable organic planarization layer having high aromatic content. FIG. 3 illustrates an example flow diagram of a process generally directed towards forming a semiconductor such as a three-dimensional (3D) FinFET. Operation 302 represents obtaining the FinFET components, e.g., via a prior process, such as the fins 101-103 of FIG. 1 and the fins 201-203 of FIG. 2. Operation 204 represents spin-coating the FinFET components with a spin mask comprising an organic planarization material with high aromatic content. As represented in the example of FIG. 2, this provides an organic planarization layer or OPL 220 (also described as an organic dielectric layer (ODL) 220). The ODL 220 can be composed of a commercially available organic dielectric layer material in some embodiments.

In one or more embodiments, the organic planarization material can be a material with a high aromatic content. As used herein, a high aromatic content can be greater than fifty percent and less than about ninety percent; in one or more embodiments, the organic planarization layer can be made up of aromatic content such as naphthalene, anthracene and/or phenyl epoxy-based moieties. Operation 306 represents curing the organic planarization material, e.g., using a hot plate of from 100° C. to about 400° C., such as based on known curing methods for these materials.

For example, implanting ions with a large atomic number ions such as arsenic (As), atomic number of 33, requires a higher substrate temperature above about 300° C. to avoid a full amorphization at the surface. Higher implant doses, higher dose rates or the speed of implantation, and dopant ions larger than arsenic (e.g. antimony Sb, indium In) require an even higher substrate temperature to avoid full amorphization. In addition, the residual crystal damage after the implantation will be progressively less at higher substrate temperatures. Ion implantation processes are conducted in a high vacuum of from about 1e-4 Torr to about 1e-7 Torr, and, more typically, from about 1e-5 Torr to about 1e-6 Torr to avoid excessive collisions between the ion beam and background neutrals. Described here is implantation at substrate temperatures above about 400° C. with the aid of a suitable soft mask capable of withstanding substrate temperatures in excess of about 400° C. in the high vacuum environment.

As an alternative to ion implantation, selective epitaxial growth with in-situ doping can be employed at elevated substrate temperatures. Selective means that the material grows epitaxially on exposed crystalline surfaces and does not grow on other surfaces such as the surfaces of amorphous materials. The substrate temperature of selective epitaxial processes can be as high as 800° C. for growing typical silicon-based epitaxial layers. In some embodiments, the selective epitaxial growth can be conducted at substrate temperatures as low as 400° C. with the aid of low-temperature precursors such as disilane ($Si_2H_6$) and germane ($GeH_4$), deposition-etch in-situ sequences, and in-situ chemical native oxide removal. The dopants can be introduced though gaseous precursors, typically, in the form of hydrates such as diborane ($B_2H_6$), phosphine ($PH_3$), and arsine ($AsH_3$). The in-situ etch cycles are enabled by introducing halogen-based vapors such HCl. Surface treatments prior to the epitaxial growth are enabled by in-situ chemical native oxide removal at low temperatures, as opposed to a more typical thermal desorption process in high vacuum or hydrogen ambient at high temperatures. Overall, silicon-based and germanium-based selective epitaxial growth with in-situ doping can be conducted at substrate temperatures as low as 400° C. and, more typically, from 450° C. to 500° C. Accordingly, there is a need for suitable soft mask that is capable of withstanding epitaxial thermal cycles at above about 400° C. in the reactive ambient of selective epitaxial growth. More specifically, such soft mask shall be stable against hydrogen and halogen vapor exposure at temperatures above about 400° C. and, more preferably, at temperature from about 450° C. to about 500° C.

Figure 5:
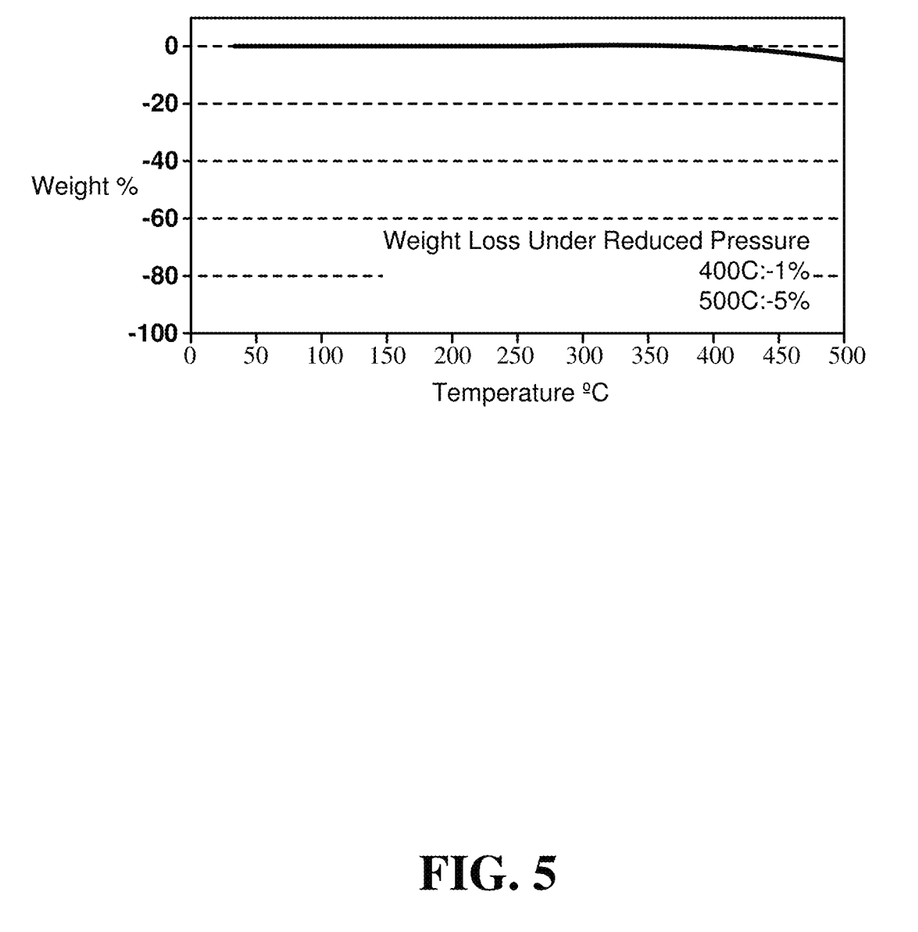
FIG. 5 is a graphical representation of high aromatic containing (90%) thermal decomposition for a spin coat organic planarization layer in accordance with one or more embodiments described herein.

Organic planarization layers (OPL's) or organic dielectric layers (ODL's) have been designed to withstand high temperatures and low pressures. For example, FIG. 5 shows thermal decomposition of a high temperature stable spin on an organic planarization layer. The material used has high aromatic C/H ratio (carbon content 80%-90% typically), with less $sp^3$ hybrid orbital carbon functionality and more C—C bond (not C—H bond). Such organic planarization layers can have a high modulus (greater than 0.6 GigaPascals (GPa)) and high film density (greater than 1.4 grams per cubic centimeter ($g/cm^3$)). This particular film starts losing weight above about 400° C. under reduced pressure indicating its decomposition and outgassing of decomposing elements.

In general, the high thermally stable organic planarization layer material described herein can provide organic planarization layers that can reflow and enable gapfill and planarization during spin coating and low temperature post coat baking. As described herein, a second high temperature post-coat bake can enable its high thermal stability. Typical organic planarization layers can be stable up to a 400° C. temperature under atmospheric and reduced pressure conditions. The thermal stability of organic planarization layers can be increased by using high temperature stable polymer backbones based on aromatic functionality such as naphthalene and anthracene and functional groups that can also undergo thermal crosslinking such as phenyl-based epoxy resins and phenyl propargyl based polymer matrices. The thermal stability of organic planarization layers can be further increased through acid catalyzed crosslinking with the addition of thermal acid generators.

Returning to FIG. 3, operation 308 represents annealing the organic planarization material at a high temperature T2, which is greater than T1 (the curing temperature, which for example can be from about 100° C. to about 400° C.). In order to prevent OPL/ODL material decomposition, this annealing operation has a substantially reduced duration at high temperature and referred to herein as "ultra-fast" annealing. In one embodiment, the annealing operation comprises annealing at a high temperature (T1 plus at least 100° C.) with millisecond annealing (e.g., T2 is on the order of 500° C.-800° C.). In some embodiments, the millisecond annealing is millisecond laser annealing. In another embodiment, the millisecond annealing is a flash lamp annealing. The duration of millisecond annealing is from about 3 milliseconds to about 300 microseconds; for example, from about 10 milliseconds to 100 microseconds. In another embodiment, the annealing operation comprises annealing at a high temperature (T1 plus at least 300° C.) with nanosecond laser annealing (e.g., T2 is on the order of 700° C.-1000° C.). The duration of nanosecond annealing is from about 10 nanoseconds to about 3 microseconds; for example, from 100 nanoseconds to 1 microsecond.

Figure 6:
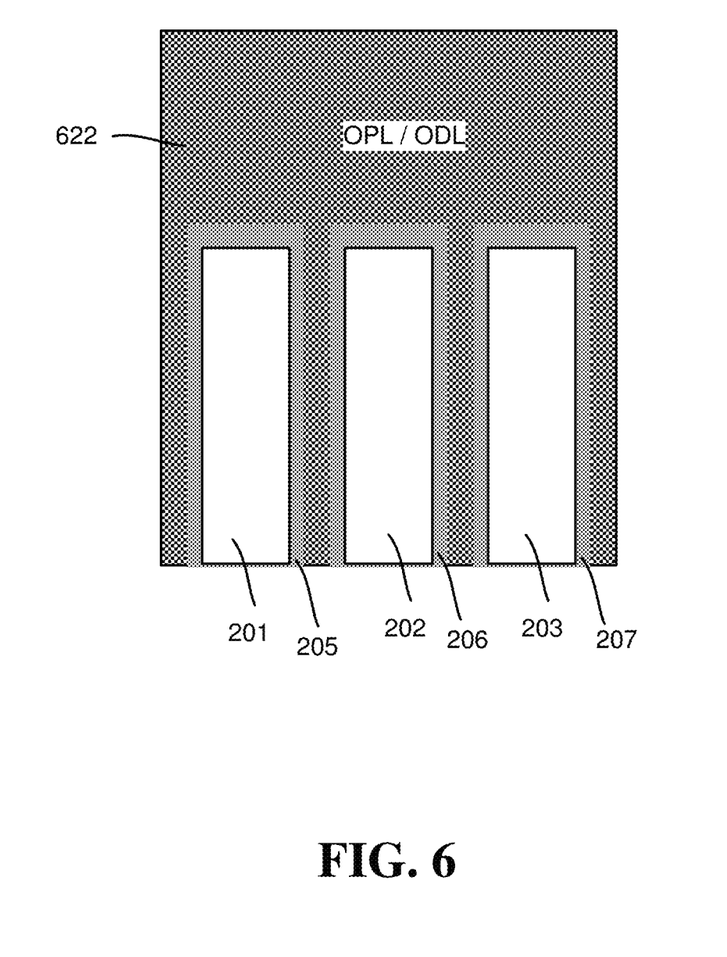
FIG. 6 is an illustration of an example, non-limiting semiconductor device comprising fins of a FinFET after spin coating and ultra-fast millisecond annealing an organic planarization layer in accordance with one or more embodiments described herein.

This ultra-fast annealing changes the state of the organic planarization layer. This is generally represented in FIG. 6 as the organic planarization layer 622, for the case of millisecond annealing where there is a uniform temperature distribution within layer 622.

Figure 7:
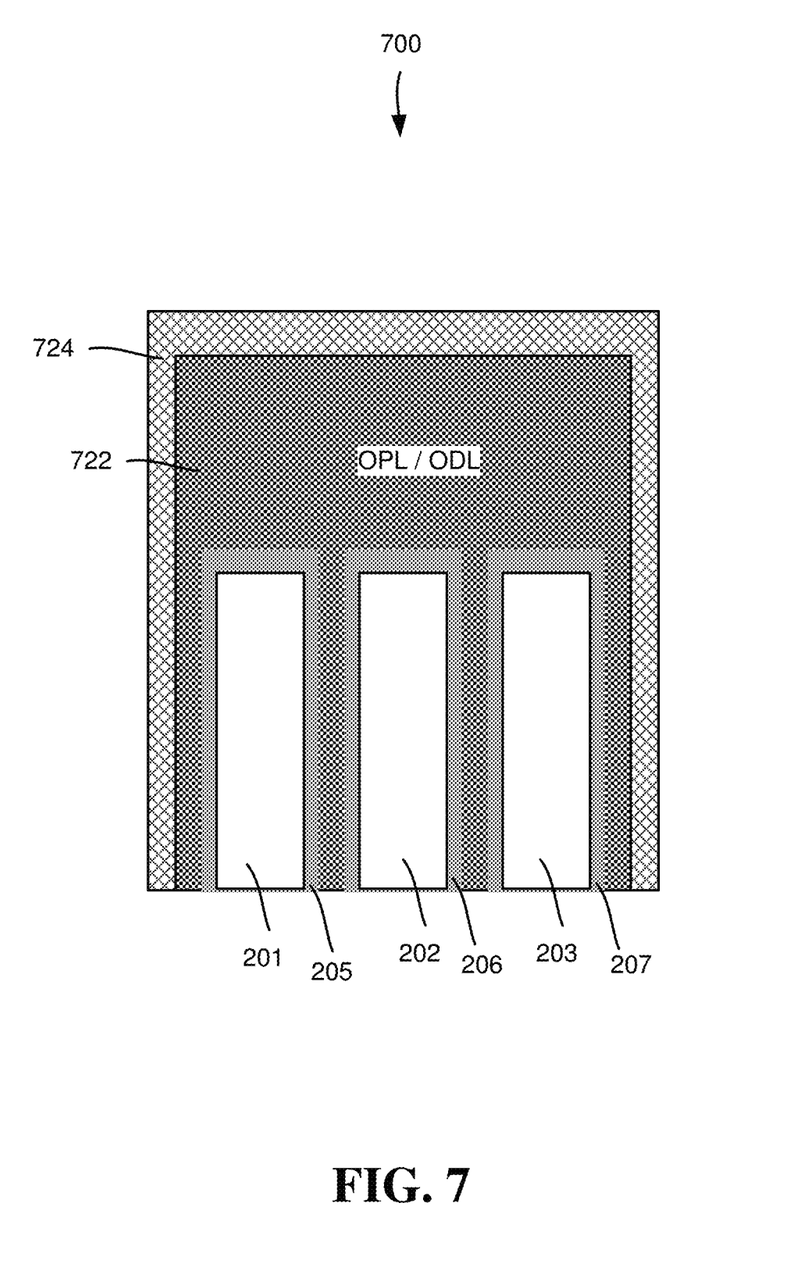
FIG. 7 is an illustration of an example, non-limiting semiconductor device comprising fins of a FinFET after spin coating and ultra-fast laser annealing an organic planarization layer in accordance with one or more embodiments described herein.

The nanosecond laser annealing operation changes the state of the organic planarization layer non-uniformly. This is generally represented in the example of FIG. 7, which exemplifies an organic planarization layer 722 in its interior and a surface crust layer 724. Due to poor thermal conductivity within the organic planarization layer, the temperature does not have time to equalize throughout the organic film during nanosecond laser exposure, leading to temperature and curing non-uniformity. Advantageously, the temperature is made higher on the surface of film (organic planarization layer) 722, creating the crust layer 724. This happens naturally for organic films that absorb nanosecond laser radiation. For this reason, short-wavelength ultraviolet (UV) laser annealing is beneficial because it can be absorbed by organic films. The crust layer 724 is made more thermally and chemically stable than the interior layer 722 and seals the soft mask structure preventing its interaction with reactive chemicals at elevated substrate temperatures.

Ultra-fast annealing of organic planarization layers enables additional crosslinking of polymer chains, reduction of C—H bonds, and an increase of C—C bonds yet preserving the block mask structure against decomposition at high temperature. In general, the OPL/ODL soft mask subjected to ultra-fast high-temperature anneals yields a more temperature stable organic material.

Figure 4:
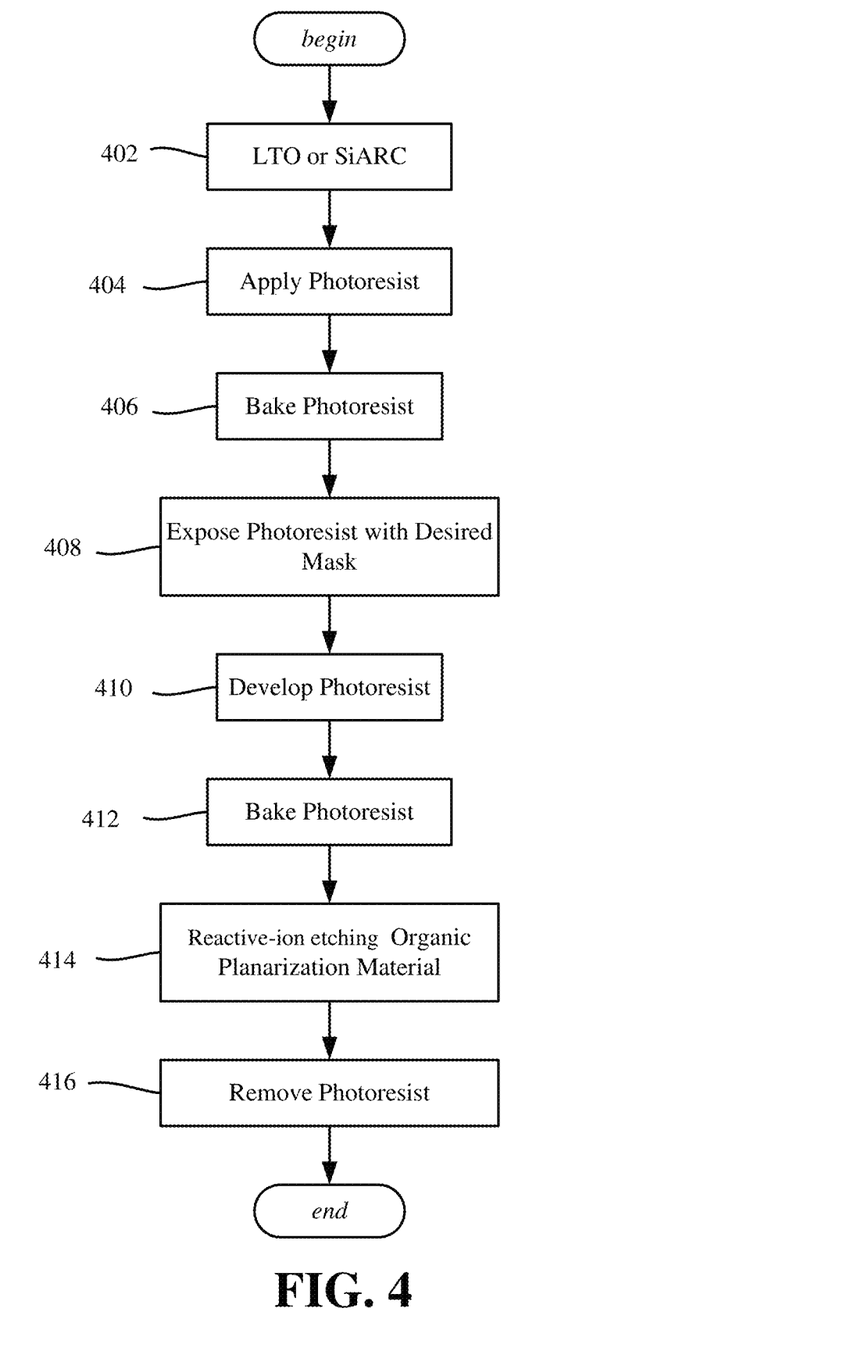
FIG. 4 illustrates an example, non-limiting flow diagram representing operations for patterning the semiconductor device corresponding to an operation in FIG. 3 in accordance with one or more embodiments described herein.
Figure 8:
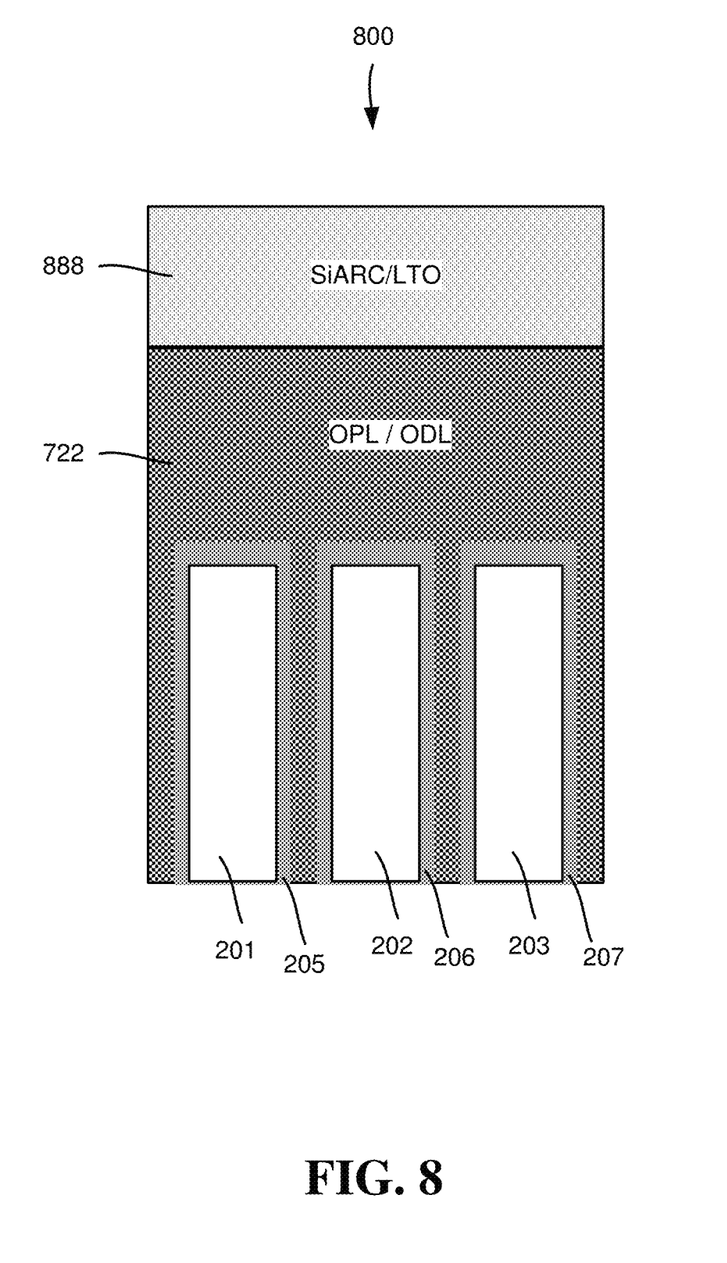
FIG. 8 is an illustration of an example, non-limiting semiconductor device comprising after annealing an organic planarization layer and adding a low temperature silicon dioxide (LTO) and/or Silicon Containing Anti-Reflective Coating layers (SiARC) in accordance with one or more embodiments described herein

After ultra-fast annealing, step 310 represents patterning (e.g., POR or known-method patterning), as further exemplified as operations in FIG. 4, beginning at step 402, which represents low temperature silicon dioxide LTO and/or Si-based antireflective coating SiARC being used in a known manner FIG. 8 represents the addition of the LTO/SiARC layer 888 on the annealed organic planarization layer 722. Optionally, the order of operations 308 and 310 can be reversed such that layer 888 is deposited prior to conducting ultra-fast, high-temperature annealing. In the case of nanosecond laser annealing, the layer 888 can be made absorbing to the laser radiation such that the surface of ODL/OPL is heated to a higher temperature.

Operation 404 of FIG. 4 represents applying photoresist, which is baked at operation 406. Operation 408 exposes the photoresist with the desired mask, and operation 410 develops the masked photoresist. Operation 412 bakes the developed photoresist. Operation 414 represents reactive-ion etching the organic planarization material, and operation 416 removes the photoresist, e.g., via etching.

At this time, the semiconductor structure is ready with the high temperature soft mask for device implanting or doping or the like using one or more high temperature processes, such as hot implant and other high-temperature processes. Other high temperature processes that can be used include high temperature epitaxial growth or high temperature thermal anneals. Operation 312 of FIG. 3 represents this process. Alternatively, the step 308 of ultra-fast annealing can be conducted after operation 416 but prior to operation 312 of FIG. 3.

Operation 314 represents cleaning operations including stripping the block mask stack. Step 314 also represents removing the organic planarization layer and SiARC/LTO layer. The organic block mask is typically removed via ashing in either oxygen or hydrogen plasma ambient. Despite high-temperature, ultra-fast annealing and resultant increased carbonization, the organic soft mask is easily removed by ashing because atomic hydrogen or oxygen readily react with the carbon network of annealed ODL/OPL layer producing volatile molecules such as CO, CO2, CH4, etc. After removal of block layer(s) the substrate is ready for the next process operation.

Figure 9:
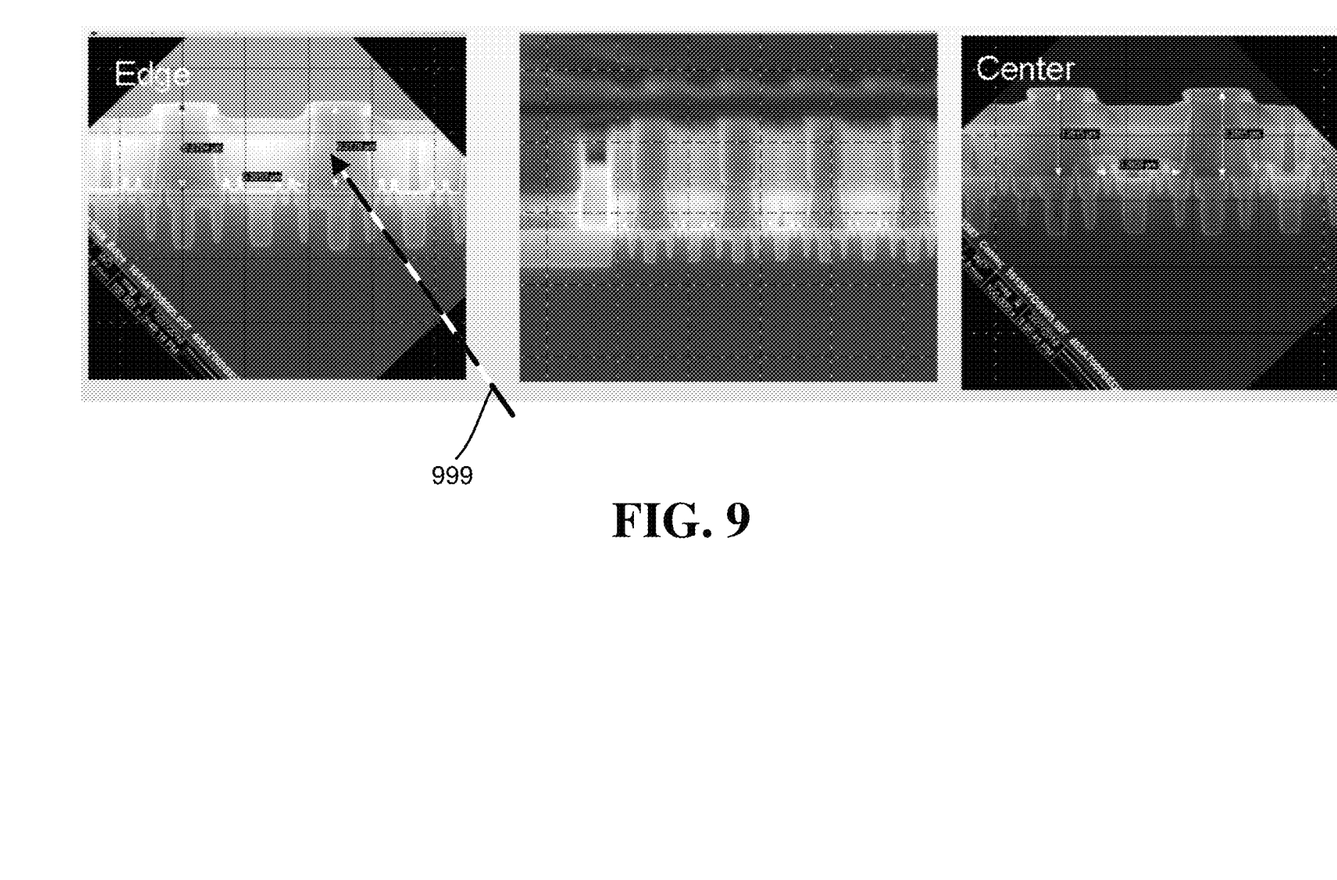
FIG. 9 is a set of images of cross sections showing operability results after the various operations in accordance with one or more embodiments described herein.

FIG. 9 comprises images of cross sections of fabricated semiconductors using the technology described herein including high temperature organic planarization layers. As pointed out by the dashed arrow labeled 999, the organic planarization layer shows reasonably good gapfill and center-to-edge uniformity in the protected area.

Figure 10:
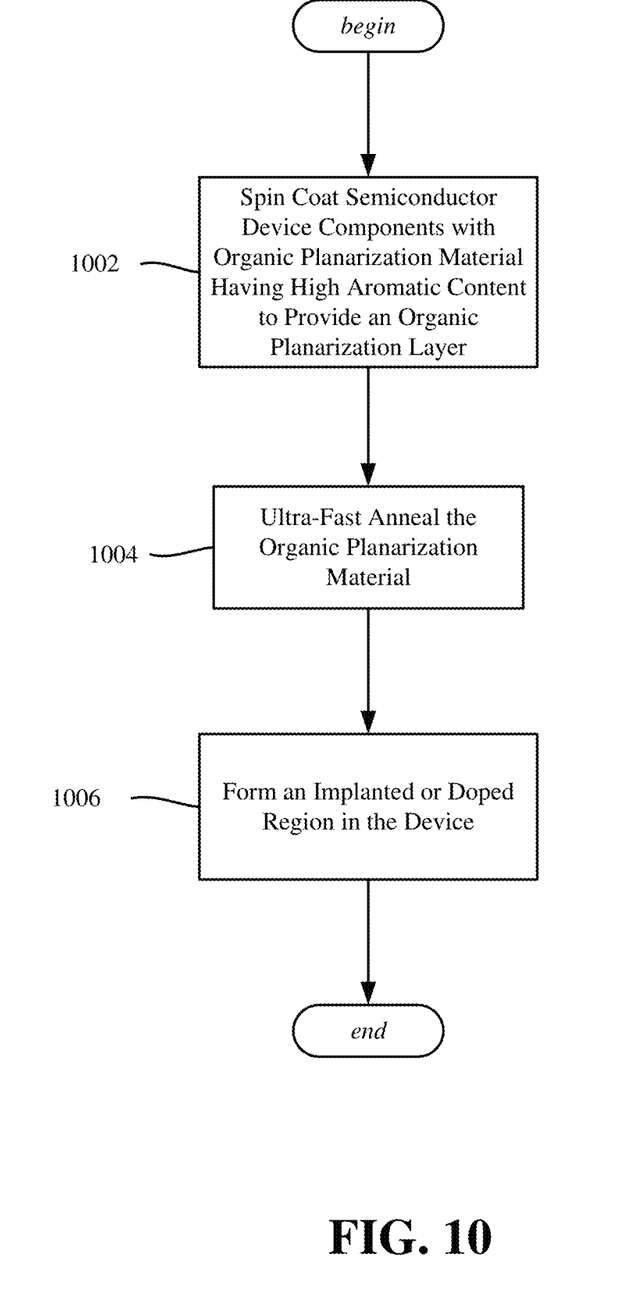
FIG. 10 illustrates a flow diagram of an example, non-limiting method in accordance with one or more embodiments described herein.

FIG. 10 illustrates operations of an embodiment. Operation 1002 represents spin coating semiconductor device components with organic planarization material having a defined aromatic content aromatic content to provide an organic planarization layer. Operation 1004 represents ultra-fast annealing the organic planarization layer. Operation 1006 represents forming an implanted or doped region in a semiconductor device.

Spin coating the semiconductor device components can comprise spin coating three-dimensional Fin Field Effect Transistor components. Spin coating the semiconductor device with the organic planarization material having the defined aromatic content can comprise using an organic planarization material with an aromatic content of greater than or equal to twenty percent. Spin coating the semiconductor device with the organic planarization material having the defined aromatic content can comprise spin coating with a material comprising naphthalene, anthracene, and/or a phenyl epoxy-based moiety.

After spin coating and before ultra-fast annealing, aspects can comprise curing the semiconductor device at a first temperature; the ultra-fast annealing the organic planarization layer can comprise annealing at a second temperature that exceeds the first temperature by at least 100° C.

Ultra-fast annealing the organic planarization layer can comprise performing a millisecond annealing process with a temperature between 500° C. and 800° C. Ultra-fast annealing the organic planarization layer can comprise performing millisecond laser annealing or performing millisecond flash lamp annealing. Ultra-fast annealing the organic planarization layer can comprise performing millisecond annealing for a duration of between about 3 milliseconds to about 300 microseconds.

Ultra-fast annealing the organic planarization layer can comprise nanosecond laser annealing with a temperature between 700° C. and 1000° C. Ultra-fast annealing the organic planarization layer can comprise nanosecond laser annealing for a duration between about 10 nanoseconds (nsec) to about 3 microseconds.

Other aspects can comprise patterning the semiconductor device, comprising applying photoresist material to the semiconductor device, baking the photoresist material applied to the semiconductor device, exposing the photoresist material with a desired mask, developing the photoresist material after exposing, baking the photoresist material in a post-development operation, reactive ion etching the organic planarization layer, and removing the photoresist material.

Forming the implanted region in the semiconductor device can comprise performing a hot implantation process. Forming the doped region in the semiconductor device can comprise performing a high temperature epitaxial growth process.

Aspects can comprise spin coating three-dimensional Fin Field Effect Transistor components of a device with organic planarization material having a defined aromatic content of at least thirty-five percent to provide an organic planarization layer and curing the device at a first temperature. Other aspects can comprise ultra-fast annealing the organic planarization layer at a second temperature that is greater than the first temperature, patterning the device, and forming an implanted or doped region in a semiconductor device.

Spin coating the three-dimensional Fin Field Effect Transistor components with the organic planarization material having the defined aromatic content comprises using an organic planarization material with an aromatic content greater than or equal to twenty percent. Ultra-fast annealing the organic planarization layer can comprise using a millisecond annealing process with an annealing temperature between about 500° C. and about 800° C. and an annealing duration between about 3 milliseconds to about 300 microseconds. Ultra-fast annealing the organic planarization layer can comprise using a nanosecond laser annealing process with an annealing temperature between 700° C. and 1000° C. and an annealing duration between about 10 nsec to about 3 microseconds.

Aspects can comprise spin coating semiconductor device components with organic planarization material having a defined aromatic content, ultra-fast annealing an organic planarization layer; and forming an implanted or doped region in a semiconductor device. Ultra-fast annealing the organic planarization layer can comprise using a millisecond annealing process. Ultra-fast annealing the organic planarization layer can comprise using a nanosecond laser annealing process.

As can be seen, described herein are one or more techniques for a high temperature soft mask in semiconductor devices, e.g., for hot implants and epitaxial growth. Spin coating with an organic planarization material with high aromatic content, along with annealing of the organic planarization layer at a high temperature, provides a soft mask for the subsequent process(es) conducted at temperature from about 400° C. to about 550° C.

What has been described above include mere examples. It is, of course, not possible to describe every conceivable combination of components, materials or the like for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   spin coating semiconductor device components with organic planarization material having a defined aromatic content to provide an organic planarization layer;
   ultra-fast annealing the organic planarization layer, wherein the ultra-fast annealing the organic planarization layer comprises performing millisecond laser annealing; and forming an implanted or doped region in a semiconductor device.

2. The method of claim 1, wherein the spin coating the semiconductor device components comprises spin coating three-dimensional Fin Field Effect Transistor components.

3. The method of claim 1, wherein the spin coating the semiconductor device with the organic planarization material having the defined aromatic content comprises using an organic planarization material with an aromatic content of greater than or equal to twenty percent.

4. The method of claim 1, wherein the spin coating the semiconductor device with the organic planarization material having the defined aromatic content comprises spin coating with a material comprising naphthalene, anthracene, or a phenyl epoxy-phenyl propargyl based moiety, or any combination of naphthalene, anthracene, or a phenyl epoxy-based moiety.

5. The method of claim 1, further comprising, after spin coating and before ultra-fast annealing, curing the semiconductor device at a first temperature, and wherein the ultra-fast annealing the organic planarization layer comprises annealing at a second temperature that exceeds the first temperature by at least 100 degrees Celsius (° C.).

6. The method of claim 1, wherein the ultra-fast annealing the organic planarization layer comprises performing a millisecond annealing process with a temperature between 500 degrees Celsius (° C.) and 800° C.

7. The method of claim 1, wherein the ultra-fast annealing the organic planarization layer comprises performing millisecond annealing for a duration of between about 3 milliseconds to about 300 microseconds.

8. The method of claim 1, wherein the ultra-fast annealing the organic planarization layer comprises nanosecond laser annealing with a temperature between 700 degrees Celsius (° C.) and 1000° C.

9. The method of claim 1, wherein the ultra-fast annealing the organic planarization layer comprises nanosecond laser annealing for a duration between about 10 nanoseconds to about 3 microseconds.

10. The method of claim 1, further comprising, patterning the semiconductor device, comprising: applying photoresist material to the semiconductor device, baking the photoresist material applied to the semiconductor device, exposing the photoresist material with a desired mask, developing the photoresist material after exposing, baking the photoresist material in a post-development operation, reactive ion etching the organic planarization layer, and removing the photoresist material.

11. The method of claim 1, wherein the forming the implanted or doped region in the semiconductor device comprises performing a hot implantation process.

12. The method of claim 1, wherein the forming the doped region in the semiconductor device comprises performing a high temperature epitaxial growth process.

13. A method comprising:
spin coating three-dimensional Fin Field Effect Transistor components of a device with organic planarization material having a defined aromatic content of at least thirty-five percent to provide an organic planarization layer;
curing the device at a first temperature;
ultra-fast annealing the organic planarization layer at a second temperature that is greater than the first temperature, wherein the ultra-fast annealing the organic planarization layer comprises performing millisecond laser annealing or performing millisecond flash lamp annealing;
patterning the device; and
forming an implanted or doped region in a semiconductor device.

14. The method of claim 13, wherein the spin coating the three-dimensional Fin Field Effect Transistor components with the organic planarization material having the defined aromatic content comprises using an organic planarization material with an aromatic content greater than or equal to twenty percent.

15. The method of claim 13, wherein the ultra-fast annealing the organic planarization layer comprises using a millisecond annealing process with an annealing temperature between about 500 degrees Celsius (° C.) and about 800° C. and an annealing duration between about 3 milliseconds to about 300 microseconds.

16. The method of claim 13, wherein the ultra-fast annealing the organic planarization layer comprises using a nanosecond laser annealing process with an annealing temperature between 700 degrees Celsius (° C.) and 1000° C. and an annealing duration between about 10 nanoseconds to about 3 microseconds.

17. A method comprising:
spin coating semiconductor device components with organic planarization material having a defined aromatic content;
ultra-fast annealing an organic planarization layer, wherein the ultra-fast annealing the organic planarization layer comprises performing millisecond laser annealing or performing millisecond flash lamp annealing; and
forming an implanted or doped region in a semiconductor device.

18. The method of claim 17, wherein the ultra-fast annealing the organic planarization layer comprises using a nanosecond laser annealing process.

* * * * *